(12) United States Patent  
Aoi

(10) Patent No.: US 7,947,338 B2
(45) Date of Patent: May 24, 2011

(54) METHOD OF FORMING AN INTERLAYER INSULATING FILM HAVING A SILOXANE SKELETON

(75) Inventor: Nobuo Aoi, Hyogo (JP)

(73) Assignee: Panasonic Corporation, Osaka (JP)

( * ) Notice: Subject to any disclaimer, the term of this patent is extended or adjusted under 35 U.S.C. 154(b) by 684 days.

(21) Appl. No.: 11/917,375

(22) PCT Filed: Mar. 13, 2006

(86) PCT No.: PCT/JP2006/304915
§ 371 (c)(1),
(2), (4) Date: Dec. 13, 2007

(87) PCT Pub. No.: WO2006/137196
PCT Pub. Date: Dec. 28, 2006

(65) Prior Publication Data
US 2009/0298298 A1  Dec. 3, 2009

(30) Foreign Application Priority Data
Jun. 24, 2005 (JP) ................................. 2005-184247

(51) Int. Cl.
*C23C 16/40* (2006.01)
*H05H 1/24* (2006.01)

(52) U.S. Cl. .................. 427/578; 427/579; 427/255.29; 427/255.37

(58) Field of Classification Search .................. 427/578, 427/579, 255.31, 255.37, 255.29
See application file for complete search history.

(56) References Cited

U.S. PATENT DOCUMENTS

| 6,387,824 B1 * | 5/2002 | Aoi ............................... 438/778 |
| 6,440,876 B1 * | 8/2002 | Wang et al. .................... 438/778 |
| 6,602,802 B2 * | 8/2003 | Aoi ............................... 438/778 |
| 2004/0195660 A1 | 10/2004 | Hamada et al. |
| 2004/0216641 A1 | 11/2004 | Hamada et al. |
| 2007/0178319 A1 | 8/2007 | Hamada et al. |

FOREIGN PATENT DOCUMENTS

| JP | 2000-349084 | 12/2000 |
| JP | 2004-161877 | 6/2004 |
| JP | 2004-292643 | * 10/2004 |

OTHER PUBLICATIONS

Liu, Po-Tsun et al., "Improvement in Integration Issues for Organic Low-k Hybrid-Organic-Siloxane-Polymer". Journal of the Electrochemical Society, 148 (2) F30-F34 (2001).*

Japanese Office Action, with English translation, issued in Japanese Patent Application No. 2005-184247, mailed Oct. 5, 2010.

* cited by examiner

*Primary Examiner* — Bret Chen
(74) *Attorney, Agent, or Firm* — McDermott Will & Emery LLP

(57) ABSTRACT

In a method of forming an interlayer insulating film by plasma CVD, an organic siloxane compound including one or more silicon atoms each having at least three or more units each represented by a general formula, —O—Si($R^1R^2$)—$OR^3$ (wherein $R^1$ and $R^2$ are the same as or different from each other and are a methyl group, an ethyl group or a propyl group, and $R^3$ is the same as or different from $R^1$ and $R^2$ and is a methyl group, an ethyl group, a propyl group or a phenyl group) is used as a raw material.

4 Claims, 3 Drawing Sheets

PRESENT INVENTION

CONVENTIONAL TECHNIQUE

METHOD OF FORMING AN INTERLAYER INSULATING FILM HAVING A SILOXANE SKELETON

RELATED APPLICATIONS

This application is the U.S. National Phase under 35 U.S.C. §371 of International Application No. PCT/JP2006/304915, filed on Mar. 13, 2006, which in turn claims the benefit of Japanese Application No. 2005-184247, filed on Jun. 24, 2005, the disclosures of which Applications are incorporated by reference herein.

TECHNICAL FIELD

The present invention relates to a method of forming an interlayer insulating film and a polymer composition employed for a multilayered interconnect structure of a semiconductor integrated circuit device.

BACKGROUND ART

In accordance with development for an increased degree of integration of a semiconductor integrated circuit, capacitance between interconnects corresponding to parasitic capacitance between metal interconnects is increasing. The increase of the capacitance between interconnects increases interconnect delay time, and as a result, it prevents performance improvement of the semiconductor integrated circuit. It is noted that the interconnect delay time is so-called RC delay that is in proportion to a product of the resistance of a metal interconnect and the capacitance between interconnects.

Accordingly, in order to reduce the interconnect delay time, it is necessary to lower the resistance of a metal interconnect or to reduce the capacitance between interconnects.

Therefore, IBM and Motorola have reported semiconductor integrated circuit devices in which a copper material is used as the material for interconnects instead of an aluminum-based alloy material in order to lower the resistance of the metal interconnects. The specific resistance of the copper material is approximately ⅔ of that of the aluminum-based alloy material. Therefore, when the copper material is used as the material for the interconnects, the interconnect delay time is reduced to approximately ⅔ in simple calculation as compared with the case where the aluminum-based alloy material is used as the material for the interconnects. Accordingly, the transfer time on an interconnect can be increased by 1.5 times.

However, when the degree of integration of semiconductor integrated circuit devices is further increased, the interconnect delay time is increased, and therefore, it is apprehended that the increase of the transfer time of an interconnect will be limited even when the metal is used as the material for the interconnect. Furthermore, copper used as the interconnect material has the lowest specific resistance next to silver, and hence, even if a metal interconnect made of a silver material instead of a copper material is used, the resistance of the metal interconnect can be merely slightly lowered.

Therefore, in order to cope with further increase of the degree of integration of semiconductor integrated circuit devices, it is significant not only to lower the interconnect resistance but also to reduce the capacitance between interconnects, and for reducing the capacitance between interconnects, it is necessary to reduce the dielectric constant of an interlayer insulating film.

A silicon oxide film is conventionally used as an interlayer insulating film, and since the dielectric constant of a silicon oxide film is approximately 4 through 4.5, it is difficult to use such a silicon oxide film as an interlayer insulating film of a more highly integrated semiconductor integrated circuit device. Therefore, as an interlayer insulating film with a lower dielectric constant than a silicon oxide film, a silicon oxide film including fluorine, a carbon-containing silicon oxide film, a low dielectric constant SOG (spin on glass) film and an organic polymer film have been proposed.

Patent Document 1: Japanese Laid-Open Patent Publication No. 2000-349084

DISCLOSURE OF THE INVENTION

Problems to be Solved by the Invention

Among materials used as an interlayer insulating film with a low dielectric constant, a porous material is regarded as a promising material capable of largely lowering the dielectric constant. In an interlayer insulating film made of a porous film, the dielectric constant of the interlayer insulating film is lowered by increasing the number of pores introduced into the film (namely, the porosity).

However, when the porosity is increased in an interlayer insulating film, the dielectric constant is lowered but the mechanical strength (such as an elastic modulus, hardness and an adhesive property) is largely degraded. When the mechanical strength of an interlayer insulating film is largely degraded, it is apprehended that the interlayer insulating film may be peeled off or broken by various stress caused in integration process. It is noted that the stress herein includes stress caused in CMP (chemical mechanical polishing) performed for forming a copper interconnect, stress derived from annealing performed during the process and stress caused in bonding. Furthermore, with respect to the elastic modulus, that is, one factor of the mechanical strength, it is said that an interlayer insulating film need to have an elastic modulus of at least 8 GPa or more, and an interlayer insulating film made of a porous material and having a dielectric constant of 2 or less has an elastic modulus much smaller than 8 GPa.

In consideration of the above-described conventional situation, an object of the invention is providing an interlayer insulating film with high mechanical strength and a low dielectric constant.

Means for Solving Problems

In order to achieve the object, in the method of forming an interlayer insulating film according to a first aspect of the invention, the interlayer insulating film is formed on a substrate by plasma CVD using, as a raw material, an organic siloxane compound including one or more silicon atoms each having at least three or more units each represented by the following general formula:

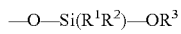
—O—Si($R^1R^2$)—$OR^3$ (wherein $R^1$ and $R^2$ are the same as or different from each other and are a methyl group, an ethyl group or a propyl group, and $R^3$ is the same as or different from $R^1$ and $R^2$ and is a methyl group, an ethyl group, a propyl group or a phenyl group.)

In the method of forming an interlayer insulating film of the first aspect of the invention, an interlayer insulating film with high mechanical strength and a low dielectric constant can be formed.

In the method of forming an interlayer insulating film according to the first aspect of the invention, the step of forming the interlayer insulating film is preferably performed without using an oxidant.

Thus, since plasma polymerization is caused without using an oxidant, generation of an oxide such as Si—OH can be suppressed, and hence, an interlayer insulating film with high quality and a lower dielectric constant can be formed.

In the method of forming an interlayer insulating film according to the first aspect of the invention, the step of forming the interlayer insulating film is preferably performed with an inert gas used as a diluent gas.

Thus, an interlayer insulating film with a lower dielectric constant can be formed.

In the method of forming an interlayer insulating film according to a second aspect of the invention, the interlayer insulating film is formed on a substrate by an application method using, as a raw material, an organic siloxane compound including one or more silicon atoms each having at least three or more units each represented by the following general formula:

—O—Si($R^1R^2$)—$OR^3$ (wherein $R^1$ and $R^2$ are the same as or different from each other and are a methyl group, an ethyl group or a propyl group, and $R^3$ is the same as or different from $R^1$ and $R^2$ and is a methyl group, an ethyl group, a propyl group or a phenyl group.)

In the method of forming an interlayer insulating film according to the second aspect of the invention, an interlayer insulating film with high mechanical strength and a low dielectric constant can be formed. Furthermore, as compared with the case where an interlayer insulating film is formed by the plasma CVD, an interlayer insulating film with a lower dielectric constant can be formed.

The precursor solution for forming an interlayer insulating film to be used in an application method according to one aspect of the invention includes a siloxane oligomer obtained from an organic siloxane compound including one or more silicon atoms each having at least three or more units each represented by the following general formula:

—O—Si($R^1R^2$)—$OR^3$ (wherein $R^1$ and $R^2$ are the same as or different from each other and are a methyl group, an ethyl group or a propyl group, and $R^3$ is the same as or different from R' and $R^2$ and is a methyl group, an ethyl group, a propyl group or a phenyl group.)

Since the precursor solution for forming an interlayer insulating film according to the aspect of the invention includes the siloxane oligomer, a siloxane skeleton can be formed through hydrolysis and dehydration condensation of an alkoxy group in Si—OR with higher selectivity than in forming an interlayer insulating film by the plasma polymerization. Therefore, a film structure with a lower density can be obtained, and hence, an interlayer insulating film with a lower dielectric constant can be formed. The CVD material for forming an interlayer insulating film to be used in CVD according to an aspect of the invention includes an organic siloxane compound including one or more silicon atoms each having at least three or more units each represented by the following general formula:

—O—Si($R^1R^2$)—$OR^3$ (wherein $R^1$ and $R^2$ are the same as or different from each other and are a methyl group, an ethyl group or a propyl group, and $R^3$ is the same as or different from $R^1$ and $R^2$ and is a methyl group, an ethyl group, a propyl group or a phenyl group.)

When the CVD material for forming an interlayer insulating film according to the aspect of the invention is used in the plasma CVD, an interlayer insulating film with high mechanical strength and a lower dielectric constant can be formed.

The raw material for production of a siloxane oligomer to be included in a precursor solution to be used in an application method according to an aspect of the invention includes an organic siloxane compound including one or more silicon atoms each having at least three or more units each represented by the following general formula:

—O—Si($R^1R^2$)—$OR^3$ (wherein $R^1$ and $R^2$ are the same as or different from each other and are a methyl group, an ethyl group or a propyl group, and $R^3$ is the same as or different from $R^1$ and $R^2$ and is a methyl group, an ethyl group, a propyl group or a phenyl group.)

When the raw material for production of a siloxane oligomer to be included in a precursor solution according to the aspect of the invention is used, an interlayer insulating film with high mechanical strength and a low dielectric constant can be formed by the application method.

Effects of the Invention

As described so far, the present invention provides a method of forming an interlayer insulating film with high mechanical strength and a low dielectric constant by the plasma CVD or the application method. Also, the invention provides a CVD material used in the plasma CVD and a precursor solution used in the application method. As a result, as an interlayer insulating film used in a multilayered interconnect structure of an LSI, an interlayer insulating film easily applicable to high integration and having a low dielectric constant can be formed.

BEST MODE FOR CARRYING OUT THE INVENTION

As a premise of specific explanation of preferred embodiments of the invention, the technical concept of the present invention will now be described.

In order to achieve the aforementioned object, the present inventor has made various examinations, resulting in finding the following: In the case where an interlayer insulating film is to be formed by plasma CVD or an application method, an interlayer insulating film with high mechanical strength and a low dielectric constant can be formed by using, as a raw material, an organic siloxane compound including one or more silicon atoms each having at least three or more units each represented by the following general formula:

—O—Si($R^1R^2$)—$OR^3$ (wherein R' and $R^2$ are the same as or different from each other and are a methyl group, an ethyl group or a propyl group, and $R^3$ is the same as or different from $R^1$ and $R^2$ and is a methyl group, an ethyl group, a propyl group or a phenyl group.)

The mechanism of this invention will now be described by exemplifying specific materials used in a method of forming an interlayer insulating film according to Embodiment 1 or 2 of this invention.

In the method of forming an interlayer insulating film according to Embodiment 1 or 2 of this invention, a branched type organic siloxane compound [tetrakis-(dimethylmethoxysilyloxyl)silane] represented by the following Chemical Formula 1 is used as a raw material:

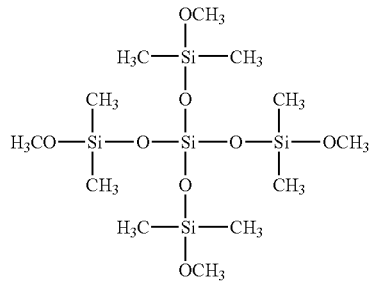

Chemical Formula 1:

In the raw material of the branched type organic siloxane compound represented by Chemical Formula 1, terminal Si—OR sites are polymerized so as to form a siloxane skeleton. Accordingly, a repeating unit of bonding is a unit of [Si—O—Si]. On the other hand, in the case where a conventional interlayer insulating film is formed, a repeating unit of bonding related to the film formation is a unit of [Si—O].

Since the repeating unit of the siloxane skeleton of this invention is the unit of [Si—O—Si] in this manner, the volume of a polymerization unit obtained in forming an interlayer insulating film by using the raw material of Chemical Formula 1 is larger than that of a polymerization unit obtained in forming a conventional interlayer insulating film such as a SiOC film having the repeating unit of [Si—O]. Accordingly, a space included in each unit structure of the interlayer insulating film formed by using the raw material of Chemical Formula 1 can be made larger. Therefore, when the raw material of Chemical Formula 1 is used, an interlayer insulating film with high mechanical strength and a low dielectric constant can be formed. This will now be specifically described.

<Low Dielectric Constant>

Figure 1A:
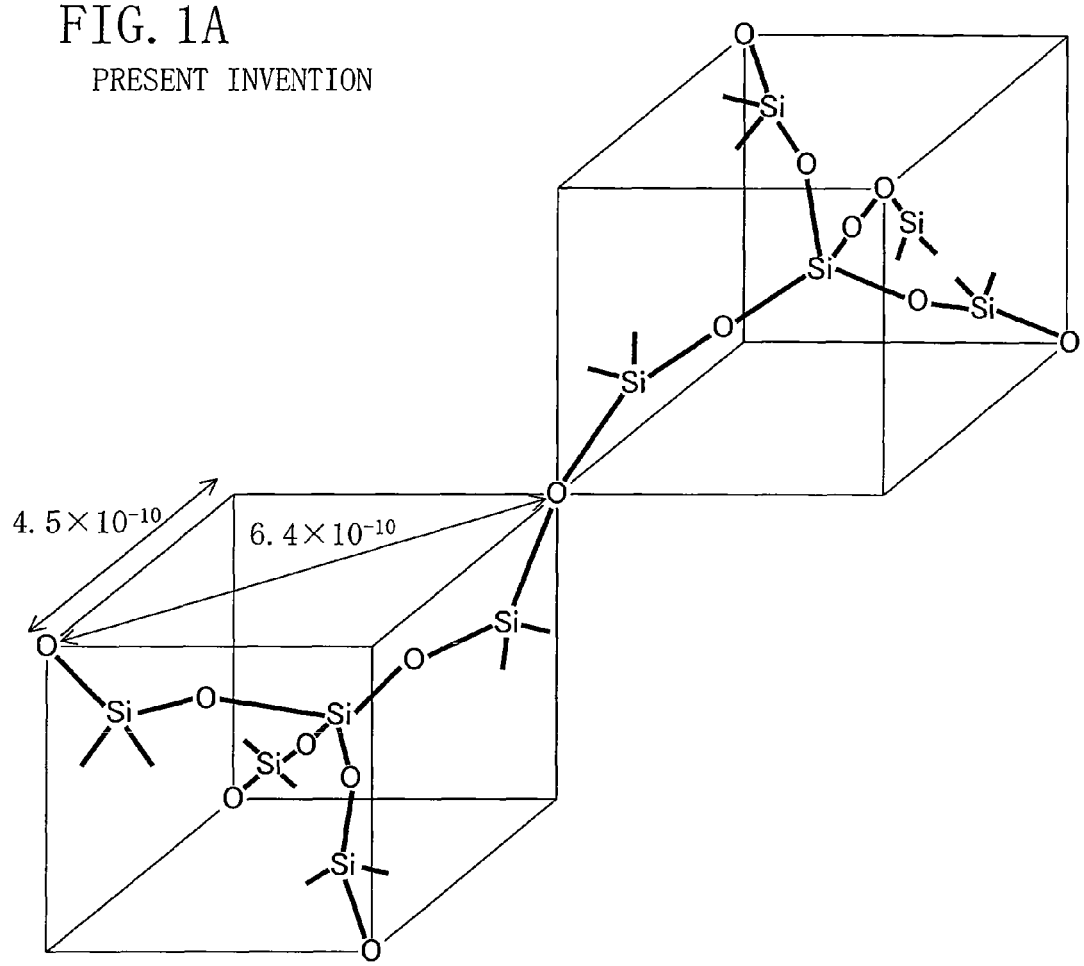
FIG. 1 is a molecular structure model diagram of a siloxane skeleton of an organic siloxane compound according to the invention.
Figure 1B:
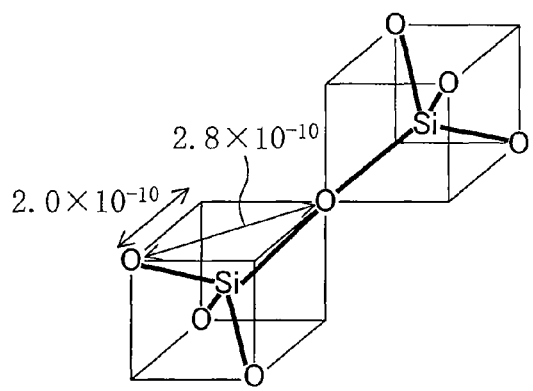

FIGS. 1A and 1B show a difference between the siloxane skeleton of the organic siloxane compound of this invention and the siloxane skeleton of a conventional organic siloxane compound. It is noted that FIG. 1A shows a molecular structure model of the siloxane skeleton of this invention and that FIG. 1B shows a molecular structure model of the conventional siloxane skeleton.

—Volume—

First, as shown in FIG. 1A, the constitutional unit of the siloxane skeleton of the organic siloxane compound of this invention is [Si—O—Si]. At this point, the volume per unit structure laying stress on Si will be roughly estimated. Specifically, when an atomic distance is calculated through molecular structure simulation, the length of one side of each unit structure of the unit skeleton is, for example, $4.5 \times 10^{-10}$ (m). Accordingly, the roughly estimated volume per unit structure is $91.1 \times 10^{-30}$ (m³).

On the other hand, the constitutional unit of the siloxane skeleton of a conventional siloxane compound (such as dimethyldimethoxysilane) is [Si—O]. At this point, the volume per unit structure laying stress on Si will be similarly roughly estimated. Since the length of one side of each unit structure of the unit skeleton is, for example, $2.0 \times 10^{-10}$ (m), the volume per unit structure is $8.0 \times 10^{-30}$ (m³).

In this manner, it is understood that the structure of the siloxane skeleton of this invention has a volume approximately eleven times as large as the volume of the structure of the conventional siloxane skeleton.

—Atomic Weight—

Next, the atomic weight per unit structure of the siloxane skeleton of the organic siloxane compound of this invention roughly estimated is $352(Si_5O_{4.5}C_8H_{24})$. On the other hand, the atomic weight per unit structure of the siloxane skeleton of the conventional organic siloxane compound roughly estimated is $64(SiO_2)$.

In this manner, it is understood that the structure of the siloxane skeleton of this invention has the atomic weight approximately 5.5 times as large as the atomic weight of the structure of the conventional siloxane skeleton.

As is understood from the above-described results of the volume and the atomic weight, although the structure of the siloxane skeleton of this invention has the volume approximately eleven times as large as that of the structure of the conventional siloxane skeleton, the atomic weight of each polymerization unit is larger by merely approximately six times.

—Film Density—

Next, the film density of the siloxane skeleton of this invention will be roughly estimated.

First, the ratio in the volume of each structural unit of the siloxane skeleton of this invention to the conventional siloxane skeleton is $91.1 \times 10^{-30}$ (m³)/$8.0 \times 10^{-30}$ (m³)=11.4 based on the aforementioned results. Also, the ratio in the atomic weight of each structural unit of the siloxane skeleton of this invention to the conventional siloxane skeleton is $352/64=5.5$. Since a film density is in proportion to the atomic weight/volume, the film density of each structural unit of the siloxane skeleton of this invention roughly estimated based on the film density of each structural unit of the conventional siloxane skeleton, that is, 2.34 g/cm³, is $(5.5/11.4) \times 2.34 = 1.12$ g/cm³. Accordingly, it is understood that an interlayer insulating film formed by using the organic siloxane compound of this invention has a structure with a film density as low as approximately 0.4 as compared with an interlayer insulating film formed by using the conventional organic siloxane compound.

—Dielectric Constant—

Next, on the basis of the above-described film density, the dielectric constant of the interlayer insulating film formed by using the organic siloxane compound of this invention will be roughly estimated.

Figure 2:
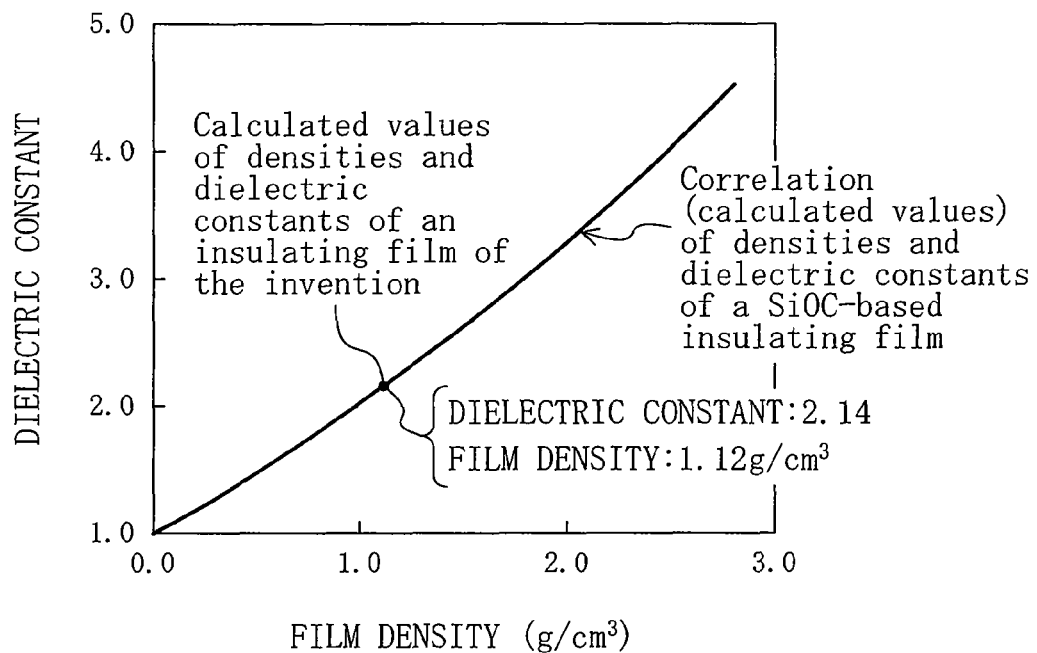
FIG. 2 is a diagram for showing the relationship between a film density and a dielectric constant of an interlayer insulating film according to the invention.

FIG. 2 shows the correlation (in calculated values) between the film density and the dielectric constant of a SiOC-based insulating film, in which the abscissa indicates the film density and the ordinate indicates the dielectric constant.

As shown in FIG. 2, it is understood that the dielectric constant is increased as the film density is increased. Since the film density of the interlayer insulating film formed by using the organic siloxane compound of this invention is 1.12 g/cm³, the dielectric constant of the interlayer insulating film formed by using the organic siloxane compound of this invention can be estimated as approximately 2.0. Accordingly, it is understood that the interlayer insulating film formed by using the organic siloxane compound of this invention has a lower dielectric constant than a general interlayer insulating film made of a SiO₂ film.

As described above, when an interlayer insulating film is formed by using the organic siloxane compound of this invention, the polymerization unit is larger and hence the film density is lowered, so that the interlayer insulating film can attain a lower dielectric constant.

<Mechanical Strength>
—Relationship Between Film Density and Elastic Modulus—

First, an elastic modulus is a constant obtained on the basis of the relationship between volume shrinkage caused by applying stress and the magnitude of the stress, and as the elastic modulus is larger, elastic strain caused by the applied stress is smaller and the mechanical strength is higher.

Figure 3:
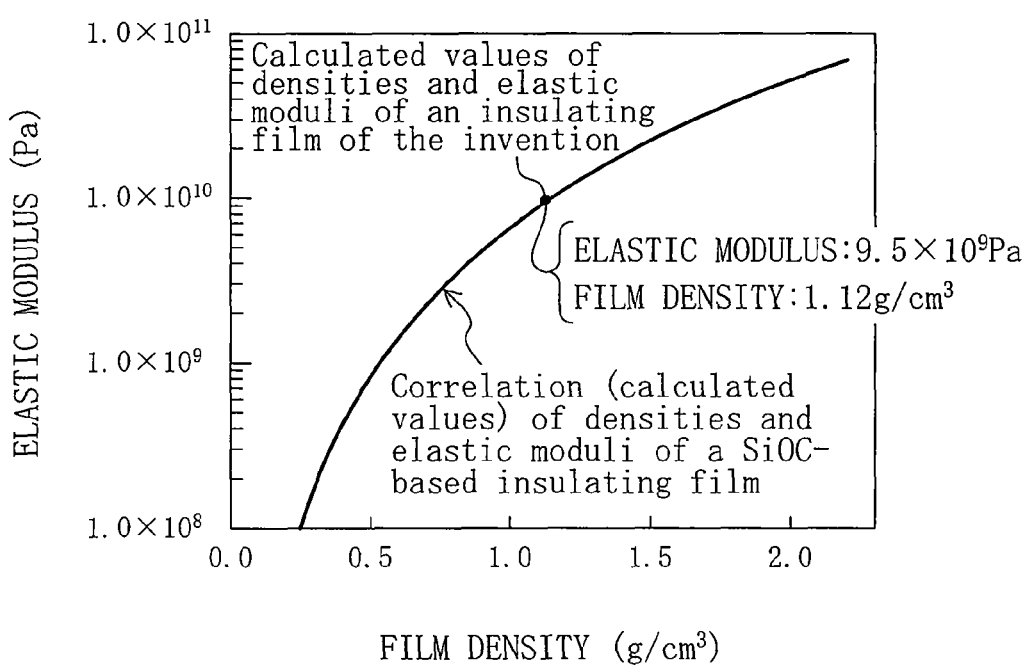
FIG. 3 is a diagram for showing the relationship between a film density and an elastic modulus of the interlayer insulating film according to the invention.

At this point, FIG. 3 shows the relationship between the film density and the elastic modulus of a SiOC-based insulating film.

Since the film density of the interlayer insulating film formed by using the organic siloxane compound of this invention is 1.12 g/cm³ as described above, the elastic modulus of the interlayer insulating film formed by using the organic siloxane compound of this invention is estimated to be approximately 9.5 GPa as shown in FIG. 3.

It is understood from this estimation that degradation of the mechanical strength of the interlayer insulating film having the siloxane skeleton of this invention can be suppressed as compared with the case where the mechanical strength of a film is estimated on the basis of the proportion of a cross-linking structure between atoms.

Specifically, when the mechanical strength of an interlayer insulating film is estimated on the basis of the proportion of a cross-linking structure between atoms, since the cross-linking structure between atoms is always formed per polymerization unit, there are four polymerization sites per structural unit in each of the siloxane skeleton of this invention and the conventional siloxane skeleton. At this point, considering that the volume of each structural unit of the siloxane skeleton of this invention is approximately eleven times as large as that of the conventional siloxane skeleton, the cross-linking density in the siloxane skeleton of this invention can be estimated as approximately $1/11$ of that of the conventional siloxane skeleton. Assuming that the film density of the interlayer insulating film formed by using the organic siloxane compound of this invention is in proportion to the ratio of the cross-linking density, the mechanical strength of the interlayer insulating film having the siloxane skeleton of this invention should be lowered to approximately $1/11$ of the mechanical strength of the interlayer insulating film having the conventional siloxane skeleton. However, the elastic modulus of the interlayer insulating film having the siloxane skeleton of this invention is actually approximately 9.5 GPa on the basis of the film density of the unit skeleton of the siloxane skeleton, and thus, the mechanical strength is not largely degraded as compared with the interlayer insulating film having the conventional siloxane skeleton.

As described so far, when an interlayer insulating film is formed by using the branched type organic siloxane compound represented by Chemical Formula 1, a lower density can be realized and the degradation of the mechanical strength can be suppressed as compared with a conventional interlayer insulating film.

Embodiment 1

A method of forming an interlayer insulating film according to Embodiment 1 of the invention will now be described with reference to the accompanying drawing.

In Embodiment 1 of the invention, a method of forming an interlayer insulating film on a substrate by plasma CVD using, as a raw material, the branched type organic siloxane compound [tetrakis-(dimethylmethoxysilyloxyl)silane] represented by Chemical Formula 1 will be described.

Figure 4:
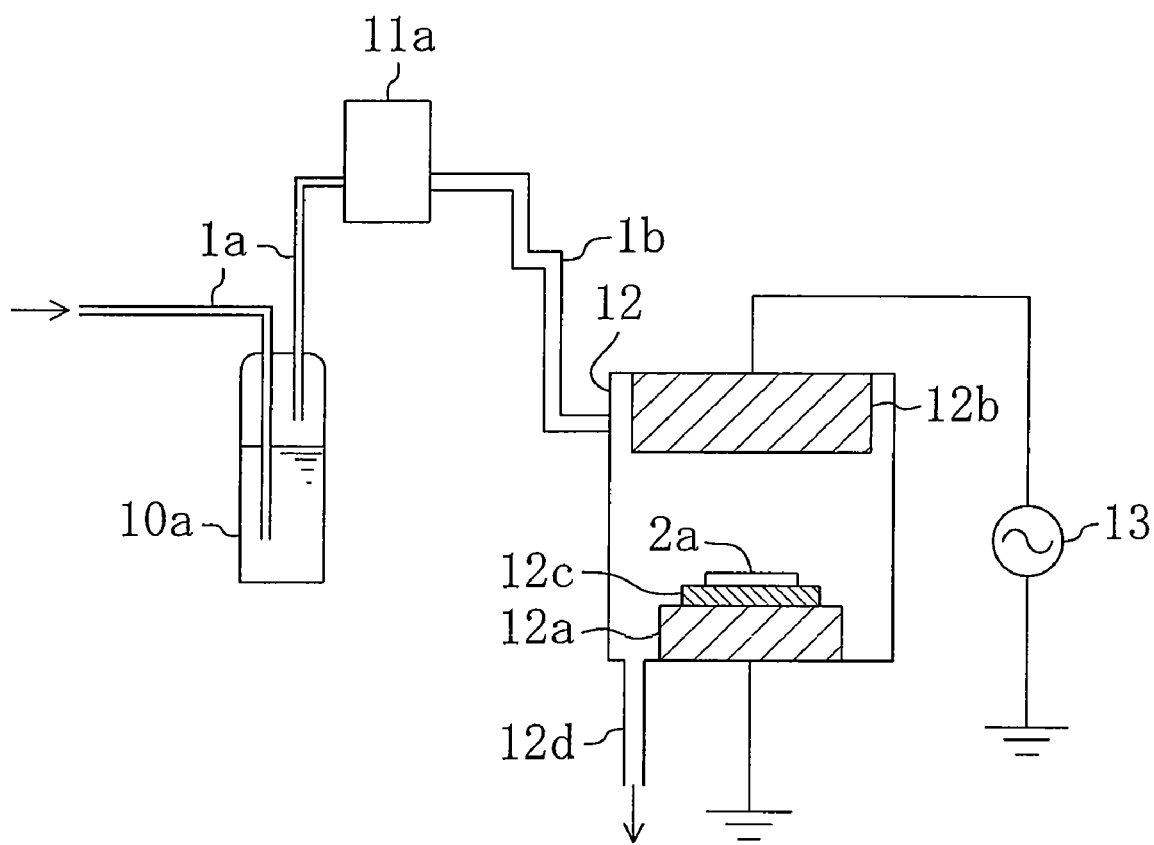
FIG. 4 is a diagram for schematically showing the architecture of a CVD system used in Embodiment 1 of the invention.

The method of forming an interlayer insulating film by the plasma CVD of Embodiment 1 is realized by using, for example, a general parallel plate type cathode-coupling type plasma CVD system whose structure is schematically shown in FIG. 4. This will now be specifically described.

First, tetrakis-(dimethylmethoxysilyloxyl)silane is filled as a CVD material in a pressure vessel 10a through a gas supply pipe 1a. The tetrakis-(dimethylmethoxysilyloxyl)silane filled in the pressure vessel 10a is fed with pressure of He to a carburetor 11a to be vaporized at 180° C. in the carburetor 11a. Subsequently, the vaporized tetrakis-(dimethylmethoxysilyloxyl)silane is introduced through a gas supply pipe 1b into a deposition chamber 12. In the deposition chamber 12, a lower electrode 12a is provided at the bottom, an upper electrode 12b is provided above the lower electrode 12a, and a deposition substrate 2a is placed on a substrate supporting part 12c provided on the lower electrode 12a. Also, an outlet 12d is provided within the deposition chamber 12 on a side of the lower electrode 12a so that a gas obtained after a reaction or a gas not sufficiently concerned with the reaction can be successively exhausted.

Specifically, plasma polymerization is performed in Embodiment 1 by applying power of 0.2 W/cm² to the lower electrode 12a and the upper electrode 12b by using an RF (radio frequency) power source 13 under conditions of pressure within the deposition chamber 12 of 400 Pa and a substrate temperature of 400° C. while introducing the tetrakis-(dimethylmethoxysilyloxyl)silane into the deposition chamber 12 at an introducing flow rate of 10 g/min. In particular, in the tetrakis-(dimethylmethoxysilyloxyl)silane used as the CVD material, a methyl group of a methoxy group is freed to be changed into a radical by the plasma so as to cause the plasma polymerization while eliminating an alkoxy group. In this manner, the interlayer insulating film of Embodiment 1 is obtained.

In the interlayer insulating film thus formed by the plasma CVD using the tetrakis-(dimethylmethoxysilyloxyl)silane as the CVD material, the dielectric constant is 1.9 and the elastic modulus is 6 GPa. This value of the elastic modulus is close to a theoretical upper limit of a low dielectric constant film made of a silicon oxide-based material. The mechanism for realizing such a value has been described above.

In Embodiment 1, when the plasma CVD is performed with a rare gas used as an inert gas, the plasma can be easily generated and hence the RF power to be applied can be reduced. Therefore, unwanted decomposition (in which a Si—R site included in the organic siloxane compound is oxidized to generate an oxidized site such as Si—OH) can be suppressed in the organic siloxane compound, and therefore, the dielectric constant of the resultant interlayer insulating film can be further lowered.

In the plasma polymerization of this embodiment, the plasma polymerization is preferably performed without using an oxidant. When the plasma polymerization is thus performed, a Si—R site included in the organic siloxane compound can be prevented from being oxidized to generate an oxidized site such as Si—OH. As a result, the following three effects can be additionally attained:

(a) Since polymerization at an oxidized site such as Si—OH generated through oxidation of a Si—R site included in the organic siloxane compound is suppressed, polymerization at a Si—OR site is priorly caused. Therefore, a siloxane skeleton with a low density can be efficiently formed, so that an interlayer insulating film with a low dielectric constant can be formed.

(b) Since increase of the hygroscopic property derived from residual of an oxidized site such as Si—OH can be suppressed, an interlayer insulating film with high quality can be formed.

(c) Since increase of the polarizability derived from generation of an oxidized site such as Si—OH can be suppressed, an interlayer insulating film with a low dielectric constant can be formed.

Embodiment 2

A method of forming an interlayer insulating film according to Embodiment 2 of the invention will now be described with reference to the accompanying drawing.

In Embodiment 2 of the invention, a method of forming an interlayer insulating film on a substrate by an application method using the branched type organic siloxane compound represented by the aforementioned Chemical Formula 1 as a raw material will be described.

In Embodiment 2, when 10 g of tetrakis-(dimethylmethoxysilyloxyl)silane is dissolved in 100 cc of mesitylene and 1 ml of acetic acid is added thereto, hydrolysis and dehydration condensation are caused so as to give a siloxane oligomer solution. After storing the siloxane oligomer solution at −5° C. for 12 hours, the resultant siloxane oligomer solution is applied onto a target substrate by spin coating with the temperature of the solution kept at 10° C. Thereafter, the target substrate on which the siloxane oligomer solution has been applied is baked with a hot plate at 160° C. for 1 minute, and the resultant substrate is annealed at 400° C. in a nitrogen atmosphere for 1 hour. Thus, an interlayer insulating film of Embodiment 2 is obtained.

In the interlayer insulating film obtained by the application method using the tetrakis-(dimethylmethoxysilyloxyl)silane as described above, the dielectric constant is 2.0 and the elastic modulus is 6.5 GPa. The mechanism for attaining such values has been described above. Also, since the siloxane oligomer solution is neutralized by acetic acid, the solution obtained after the neutralization has appropriate viscosity and is stable, and hence, it is not gelled for four months when refrigerated.

Herein, an oligomer means a polymer with a low degree of polymerization.

In employing the application method, when the siloxane oligomer is previously produced in the solution, a siloxane skeleton is formed through the hydrolysis and the dehydration condensation of an alkoxy group at a Si—OR site with higher selectivity than in employing the plasma polymerization. Therefore, a film structure made of SiOC with a low density can be realized. In the case where an interlayer insulating film is formed through the plasma polymerization, an unwanted oxidative destruction reaction may be partially caused. Therefore, as compared with the case where an interlayer insulating film is formed by the application method of Embodiment 2, the film density may be more easily increased due to cross-linkage caused at a polymerized site generated through the unwanted oxidative destruction reaction. Furthermore, in the case where an interlayer insulating film is formed through the plasma polymerization, a site with high polarizability may be generated through oxidative destruction, which may increase the dielectric constant.

INDUSTRIAL APPLICABILITY

As described above, the present invention provides a method of forming an interlayer insulating film with high mechanical strength and a low dielectric constant, and is particularly useful when the plasma CVD or the application method is employed.

The invention claimed is:

1. A method of forming an interlayer insulating film for forming the interlayer insulating film on a substrate, comprising a step of forming the interlayer insulating film by plasma CVD using, as a raw material, an organic siloxane compound including one or more silicon atoms each having at least three or more units each represented by the following general formula:

—O—Si($R^1R^2$)—$OR^3$ wherein $R^1$ and $R^2$ are the same as or different from each other and are a methyl group, an ethyl group or a propyl group, and $R^3$ is the same as or different from $R^1$ and $R^2$ and is a methyl group, an ethyl group, a propyl group or a phenyl group, and
    wherein the interlayer insulating film includes a siloxane skeleton in which a repeating unit of bonding is a unit of [Si—O—Si] formed by polymerizing Si—O—R sites in the raw material.

2. The method of forming an interlayer insulating film of claim 1, wherein the step of forming the interlayer insulating film is performed without using an oxidant.

3. The method of forming an interlayer insulating film of claim 1, wherein the step of forming the interlayer insulating film is performed with an inert gas used as a diluent gas.

4. A method of forming an interlayer insulating film for forming the interlayer insulating film on a substrate, comprising a step of forming the interlayer insulating film by an application method using, as a raw material, an organic siloxane compound including one or more silicon atoms each having at least three or more units each represented by the following general formula:

—O—Si($R^1R^2$)—$OR^3$ wherein $R^1$ and $R^2$ are the same as or different from each other and are a methyl group, an ethyl group or a propyl group, and $R^3$ is the same as or different from $R^1$ and $R^2$ and is a methyl group, an ethyl group, a propyl group or a phenyl group, and
    wherein the interlayer insulating film includes a siloxane skeleton in which a repeating unit of bonding is a unit of [Si—O—Si] formed by polymerizing Si—O—R sites in the raw material.

* * * * *